United States Patent
Horikoshi et al.

(10) Patent No.: US 7,253,639 B2
(45) Date of Patent: Aug. 7, 2007

(54) INSULATION RESISTANCE DETERIORATION DETECTION METHOD AND INSULATION RESISTANCE DETERIORATION DETECTION DEVICE FOR MOTOR, AND MOTOR DRIVER

(75) Inventors: Shinichi Horikoshi, Yamanashi (JP); Mamoru Yaeshima, Hadano (JP); Hiroyasu Sato, Yamanashi (JP)

(73) Assignee: Fanuc Ltd, Yamanashi (JP)

( * ) Notice: Subject to any disclaimer, the term of this patent is extended or adjusted under 35 U.S.C. 154(b) by 0 days.

(21) Appl. No.: 11/332,284

(22) Filed: Jan. 17, 2006

(65) Prior Publication Data

US 2006/0158197 A1  Jul. 20, 2006

(30) Foreign Application Priority Data

Jan. 18, 2005 (JP) ............................. 2005/010301
Dec. 6, 2005 (JP) ............................. 2005/352265

(51) Int. Cl.
*H01H 31/12* (2006.01)
(52) U.S. Cl. ..................................... 324/551
(58) Field of Classification Search ................. 324/551
See application file for complete search history.

(56) References Cited

U.S. PATENT DOCUMENTS

| | | | | |
|---|---|---|---|---|
| 4,562,390 A | | 12/1985 | Tobise | |
| 5,155,441 A | * | 10/1992 | Zelm | 324/551 |
| 5,243,243 A | | 9/1993 | Andrews | |
| 5,430,636 A | * | 7/1995 | Kachi | 363/58 |
| 6,421,618 B1 | | 7/2002 | Kliman et al. | |
| 6,724,313 B2 | * | 4/2004 | Sato et al. | 340/590 |
| 2005/0068000 A1 | | 3/2005 | Yamada et al. | |

FOREIGN PATENT DOCUMENTS

| EP | 1 491 907 | 12/2004 |
|---|---|---|
| GB | 2 025 170 | 1/1980 |
| JP | 2001-141795 | 5/2001 |
| JP | 2005-110400 | 4/2005 |

OTHER PUBLICATIONS

European Search Report in corresponding Patent Application No. 06250232.3-2216 dated May 24, 2006.

* cited by examiner

*Primary Examiner*—Walter Benson
*Assistant Examiner*—Timothy J Dole
(74) *Attorney, Agent, or Firm*—Staas & Halsey LLP

(57) ABSTRACT

The drive of the motor is stopped, the electromagnetic switch contacts are switched OFF, and thereafter the first and second contact points are closed to form a closed circuit of the smoothing capacitor, second contact point, first and second resistors, motor coil, ground 1, ground 2, first contact point, and smoothing capacitor. Charging voltage of the smoothing capacitor is applied to the closed circuit. If an insulation resistance of the motor deteriorates, a current flowing through the closed circuit is increased. The increase of the current is detected by means of the potential difference across the first resistor R1 in the closed circuit, to detect insulation resistance deterioration of the motor.

11 Claims, 8 Drawing Sheets

INSULATION RESISTANCE DETERIORATION DETECTION METHOD AND INSULATION RESISTANCE DETERIORATION DETECTION DEVICE FOR MOTOR, AND MOTOR DRIVER

BACKGROUND OF THE INVENTION

1. Field of the Invention

The present invention relates to a method of detecting insulation resistance deterioration of a motor, an insulation resistance deterioration detection device which implements the detection method, and a motor driver which has the insulation resistance deterioration detection device.

2. Description of the Related Art

Continuous long-term use of a motor deteriorates the insulation of the motor depending on the usage environment. A leakage breaker is actuated by a leakage current caused by the insulation resistance deterioration, and a drive unit which uses this motor suddenly stops operating. In such a case, it is unclear whether the cause of the sudden stop is in the motor or the drive unit. Investigation into the causes of the sudden stop requires a long time; which tends to extend the cessation of the device which uses the motor and the manufacturing line.

As a method of detecting insulation resistance deterioration of a motor, the method of detecting it by detecting a leakage current, as described above, is generally known. However, in an earth leakage detector, or other earth leakage detector such as an earth leakage protection relay, detection cannot be carried out until a leakage current becomes large to some extent (3 mA through 15 mA) Therefore, there is a problem that the detection is performed only when insulation resistance deterioration of the motor has advanced. Furthermore, since a sudden stop of the device using the motor is caused by earth leakage, investigation into the causes of the sudden stop has to be carried out by stopping the operation of the entire systems, such as the device and the manufacturing line, in order to find out whether the cause is in the motor itself or the motor driver. Moreover, this earth leakage detector cannot be used effectively in prediction and preventive maintenance of insulation resistance deterioration of the motor.

There is proposed a method for detecting an insulation deterioration of a compressor for an air conditioner at an early stage so as to prevent the air conditioner from becoming inoperative (see Japanese Patent Application Laid-Open No. 2001-141795, for example). According to this method, during a stopped state of the motor, high-frequency pulses are applied to one transistor constituting an electric power converter which drives the motor by converting a DC voltage to an arbitrary voltage and frequency, to drive the motor while the motor is not in operation, and a three-phase AC power supply is rectified and filtered to obtain a voltage of the DC power supply (or a voltage level which is set previously). Further, a motor current is detected. Then, an insulation resistance value is obtained based on the obtained voltage of the DC power supply and the detected motor current. If the computed insulation resistance value is below a set insulation resistance value, an alert is issued. There is also proposed a method of predicting insulation resistance deterioration, which computes the insulation resistance value of a motor by simply bringing the transistors in conduction, instead of applying high-frequency pulses to the transistor.

Although the method described in Japanese Patent Application Laid-Open No. 2001-141795 can be used effectively in prediction and preventive maintenance of insulation resistance deterioration of a motor, detection of voltage and current has to be carried out. Moreover, detection of heavy current has to be considered when using the detector, leading to increase of the cost.

Therefore, there has been applied for a patent in Japan on a motor driver which can remedy the problems of the conventional method of detecting insulation resistance deterioration of a motor, and can predict insulation resistance deterioration at low costs (Japanese Patent Application No. 2003-340009, which is hereinafter referred to as "prior application").

However, in this motor driver proposed in this prior application, the switch for connecting the AC power supply to the rectifier circuit of the motor driver is operated for a certain period of time, then the energy is accumulated in the capacitor which smoothes rectified voltage, thereafter the rectifier circuit is connected to ground, and the energy accumulated in the capacitor is applied to the motor via a detection resistor connected serially to a motor coil, at which time the potential difference between the both ends of the detection resistor is detected, whereby decline of insulation is detected. In this manner, the motor driver of the prior application requires control of actuating, for a certain period of time, the switch that connects the rectifier circuit to the AC power supply. Therefore, there is a problem that the invention of the prior application cannot be applied easily to the existing motor drivers and the like.

In addition, the insulation resistance of a motor is affected by the surrounding environment (temperature, humidity) where the motor is placed. The insulation resistance decreases, especially in high humidity. For this reason, it is desirable to understand the ambient temperature and humidity conditions when detecting insulation resistance deterioration. Furthermore, it is desirable to obtain the history of decline of the motor insulation resistance.

SUMMARY OF THE INVENTION

The present invention relates to a method of detecting insulation resistance deterioration of a motor driven by a motor driver which comprises a power supply section in which the electric power supplied from an AC power supply through a switch is rectified by a rectifier circuit and smoothed by a capacitor; and a motor driving amplifier in which a DC voltage from the power supply section is converted to an AC voltage to drive the motor. The method according to the present invention has the steps of connecting one end of the capacitor to ground after stopping the operation of the motor by turning the switch OFF, and connecting the other end to a motor coil, and detecting a current that flows through a closed circuit formed with the capacitor, motor coil, and ground, to detect insulation resistance deterioration of the motor.

Further, the present invention relates to an insulation resistance deterioration detection device for a motor that comprises a power supply section in which the electric power supplied from an AC power supply through a switch is rectified by a rectifier circuit and smoothed by a capacitor, and a motor driving amplifier in which a DC voltage from the power supply section is converted to an AC voltage to drive a motor. The device according to the present invention has a contact point for connecting one end of the capacitor to ground, means for switching the contact point ON based on a signal sent from the motor driver to turn the switch OFF, and insulation resistance deterioration detection means, connected between the other end of the capacitor and a motor coil, for detecting a current that flows through a closed circuit, which is formed with the contact point, capacitor, motor coil, and ground, to detect insulation resistance deterioration.

The device for detecting insulation resistance deterioration of the motor according to the present invention can have the following embodiments.

A resistor or a current sensor is provided in the closed circuit. The insulation resistance deterioration detection means detects the potential difference generated on both ends of the resistor to detect the magnitude of a flowing current or to detect the magnitude of a current flowing through the current sensor, for detecting insulation resistance deterioration of the motor.

The insulation resistance deterioration detection means detects insulation resistance deterioration of the motor according to the magnitude of an output from a current detector the motor driver provides for control of the motor.

The insulation resistance deterioration detection means has a comparator which compares a current detection value with a reference value, and display means for displaying a comparison result of the comparator.

The insulation resistance deterioration detection means has an A/D converter which converts the current detection value into a digital signal, a memory which stores the current detection value converted into the digital signal, and display means for displaying the current detection value converted into the digital signal, wherein data accumulated in the memory is displayed in the form of a list or a graph, on the display means. Further, by providing a detector which detects at least either ambient temperature or humidity is provided, or by providing an interface for connecting the detector which detects at least either ambient temperature or humidity, temperature/humidity data which is detected by the detector when detecting the current detection value, as well as data of the current detection value, are stored in the memory, and the current detection value data and the temperature/humidity data are displayed on the display means in the form of a list or a graph.

By providing the detector which detects at least one of either ambient temperature or humidity, or by providing the interface for connecting the detector which detects at least one of ambient temperature or humidity, the temperature and humidity detected by the detector are displayed.

As the power supply for flowing the current through the closed circuit in order to detect the insulation resistance deterioration, charge accumulated in the capacitor is used.

The insulation resistance deterioration detection means has voltage detection means for detecting the potential difference between the both ends of the capacitor, wherein the insulation resistance deterioration detection is performed when the voltage detection means detects a voltage of a predetermined value after the output of the signal to turn OFF the switch connected to the motor driver. The insulation resistance deterioration detection means has a latch circuit, and, when a voltage of a predetermined value is detected by the voltage detection means, a signal for detecting insulation resistance deterioration is latched in the latch circuit to detect the insulation resistance deterioration.

In the contact point, one end of the capacitor is connected to ground via the DC power supply, instead of connecting the end of the capacitor to ground directly.

According to the present invention, a motor insulation resistance to ground can be easily measured to detect decline of the insulation. Furthermore, when the motor insulation resistance to ground is measured, the temperature or humidity can also be measured and displayed, whereby the decline of an insulation resistance of the motor can be judged more accurately. Moreover, the data that shows a value of the measured insulation resistance, and the data of temperature or humidity when obtaining the above data is displayed visually in the form of a list or graph, whereby the history of decline of the insulation resistance and the environment at the time of the decline can be learned, thus the present invention is useful in maintenance such as replacement of the motor.

BRIEF DESCRIPTION OF THE DRAWINGS

The above-described and other objects and characteristics of the present invention are made apparent in the description of the embodiments below with reference to the attached drawings, in which.

DESCRIPTION OF THE PREFERRED EMBODIMENTS

Figure 1:
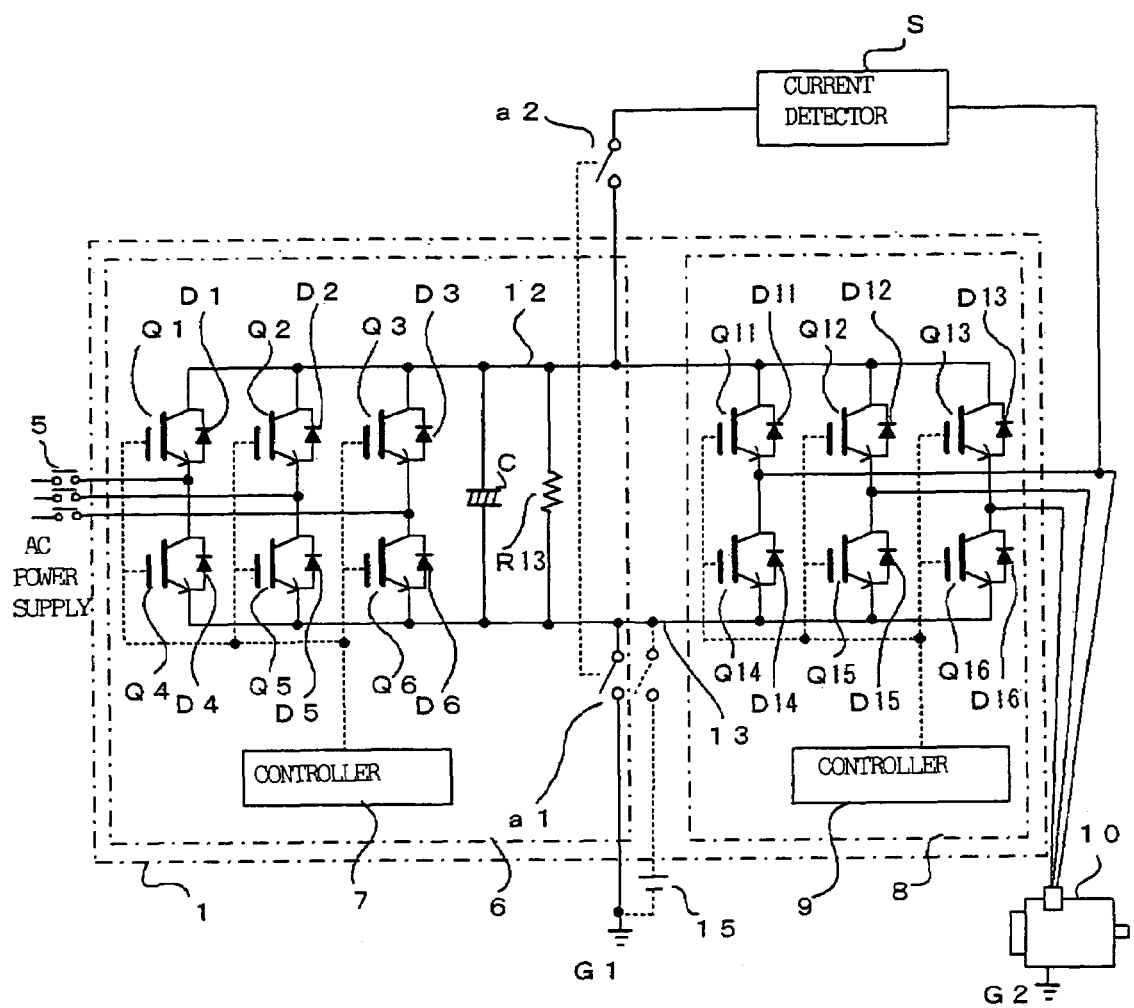
FIG. 1 is a circuit drawing showing a first embodiment of the motor insulation resistance deterioration detection device according to the present invention.

FIG. 1 is an explanatory drawing of a first embodiment of the method for detecting insulation resistance deterioration of a motor and the insulation resistance deterioration detection device according to the present invention.

A motor driver 1 which drives a motor 10 comprises a power supply section 6 in which a three-phase AC power supply is converted to a DC power supply by a rectifier circuit, and a motor driving amplifier 8 in which the DC power supply converted in the power supply section 6 is converted to any AC power supply to drive the motor 10.

The power supply section 6 of the motor driver 1 has: a rectifier circuit which is configured by diodes D1 through D6 for rectifying electric power supplied from a three-phase AC power supply through electromagnetic switch contacts 5 and converting the electric power to a DC power supply; switching elements Q1 through Q6, each of which is configured with an IGBT or the like, connected in parallel with the diodes D1 to D6, and feeding back regenerative current to the AC power supply; a controller 7 for controlling the switching elements Q1 through Q6; a smoothing capacitor C for smoothing the rectified DC output obtained from the rectifier circuit having the diodes D1 through D6; and a discharging resistor R13 for discharging the energy of the smoothing capacitor C.

Further, the motor drive amplifier 8 has an inverter circuit consisting of switching elements Q11 through Q16, each of which is configured with an IGBT or the like, and diodes D11 through D16 which are connected in parallel with the switching elements Q11 through Q16 respectively. The motor drive amplifier 8 also has a controller 9. The output side of the inverter circuit is connected to the motor 10.

Output lines 12, 13 (in a DC link section) of the rectifier circuit in the power supply section 6 are connected to the motor drive amplifier 8 and supply DC voltage to the motor drive amplifier 8.

The controller 7 in the power supply section 6 and the controller 9 in the motor drive amplifier 8 are both connected to a control unit (for example, a numerical control unit) which controls the motor driver. The controller 9 controls ON/OFF operations of the switching elements Q11 through Q16 according to commands issued from the control unit, to control the driving of the motor 10. The controller 9 also controls ON/OFF operation of the electromagnetic switch contacts 5 according to the commands from the control unit.

The motor driver 1 described above is substantially the same as that of a conventional motor driver. In order to detect insulation resistance deterioration of the motor 10, the motor driver and the motor of the present embodiment are provided with a first contact point a1 for connecting one end of the capacitor C (specifically, a negative-side line 13 in the DC link section) to ground, and a second contact point a2 for connecting the other end of the capacitor C (specifically, a positive-side line 12 in the DC link section) to a current detector S (described hereinafter). The insulation resistance deterioration detection device is configured with these first and second contact points a1 and a2 and the current detector S.

The first contact point a1 and the second contact point a2 operate in conjunction with each other, and are constructed from a relay contact point or an interlocking contact point which is operated manually. Further, the current detector S is provided between the positive-side line 12 of the DC link section and one phase line of a connecting wire for connecting a coil of the motor 10, to detect a current flowing a conductor which connects the both positive-side line 12 and the motor 10. The current detector S can be configured with various existing current sensors such as a current sensor in which Hall elements are used, or a current sensor in which a detection resistor is provided in a part of a conductor to detect a current flowing in the conductor and a resistor on the basis of the potential difference between both ends of the detection resistor.

In order to detect insulation resistance deterioration of the motor 10, the first and second contact points a1 and a2 are switched ON by means of manual operation or actuating the relay after the electromagnetic switch contacts 5 are switched OFF. The negative-side line 13 in the DC link section is connected to ground by switching the first contact point a1 ON. The positive-side line 12 in the DC link section is connected to the current detector S by switching the second contact point a2 ON. As a result, a closed circuit of the capacitor C, second contact point a2, current detector S, motor coil, grounds G2 and G1, first contact point a1, and capacitor C is formed, and the energy accumulated in the capacitor C is discharged via this closed circuit.

The magnitude of the current flowing through the closed circuit is small if an insulation resistance of the motor is large, thus a detected value in the current detector S is small. On the other hand, if the insulation resistance of the motor deteriorates, the current flowing through the closed circuit increases, whereby the detected value detected in the current detector S increases. Then the detected value in the current detector S becomes a predetermined value or above, it is determined that the insulation of the motor has deteriorated.

It should be noted in the example shown in FIG. 1 that the current detector S is provided between the positive-side line 12 of the DC link section and one phase line of the connecting wire for connecting the coil of the motor 10. However, since the current detector S measures a current flowing through the closed circuit, it may be placed in anywhere in the closed circuit. The current detector S may be placed, for example, between the first contact point a1 and ground.

The current detector S is configured by a resistor for detection which is inserted into the conductor connecting between the positive-side line 12 of the DC link section and one phase line of the connecting wire for connecting the coil of the motor 10. When detecting a current flowing through the conductor on the basis of the potential difference between the both ends of the detection resistor, even if the resistance value of the detection resistor inserted into the conductor is large and the current detector S is kept connected, the second contact point a2 may be eliminated, as long as the operation of the motor is not affected.

Figure 2:
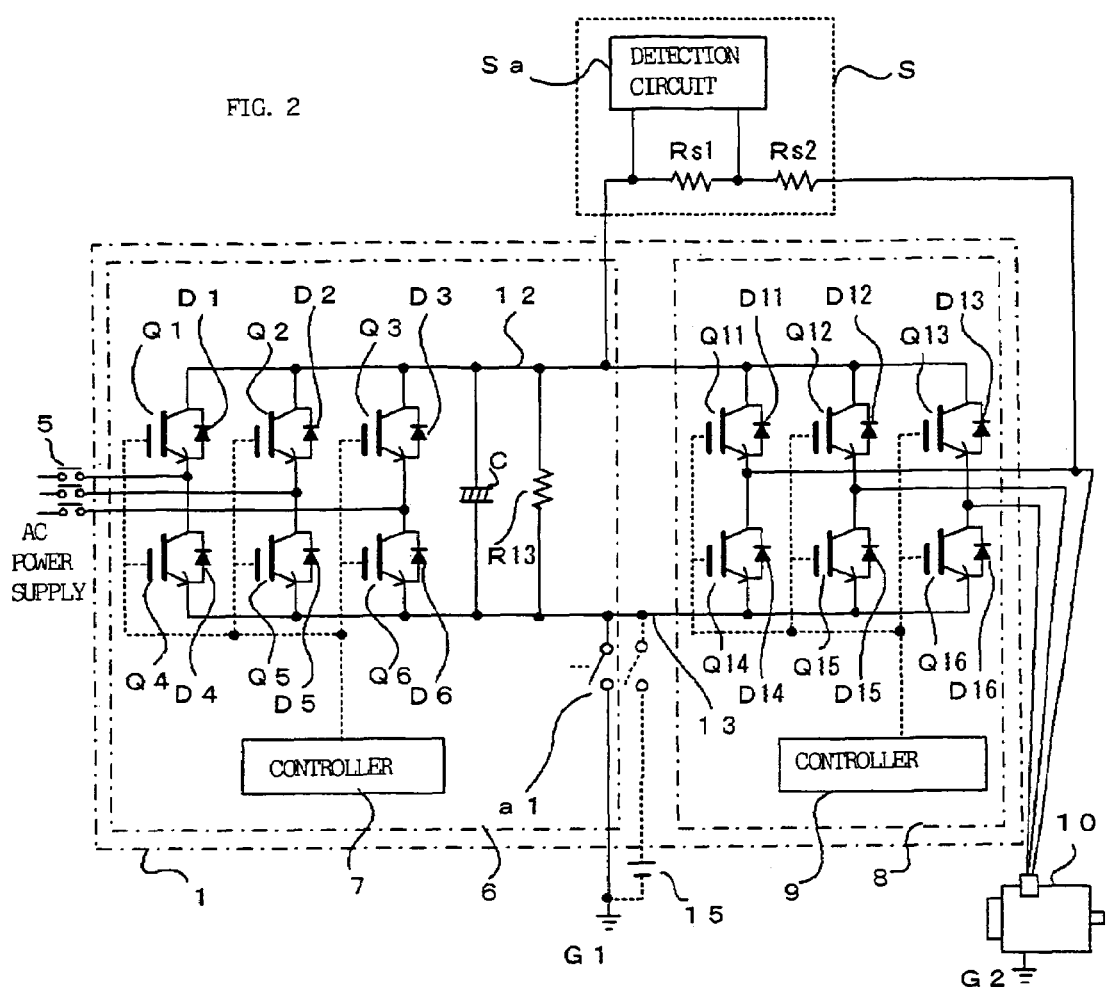
FIG. 2 is a circuit drawing showing a second embodiment of the motor insulation resistance deterioration detection device according to the present invention.

FIG. 2 shows a second embodiment of the present invention in which the second contact point is eliminated.

In this embodiment, a resistor Rs1 and a resistor Rs2 are connected in series between the positive-side line 12 of the DC link section and one phase line of the connecting wire for connecting the coil of the motor 10, and the potential difference between both ends of the resistor Rs1 (detection resistor) is detected by a detection circuit Sa, whereby it is determined whether the insulation of the motor has deteriorated.

Further, in the motor driver, usually, the current that flows through each phase (at least two phases) is detected by the current detector, and the detected current is fed back to perform current loop control. The current detector which is used for performing the current loop control may be utilized to perform the detection of insulation resistance deterioration of the motor of the present invention.

Figure 3:
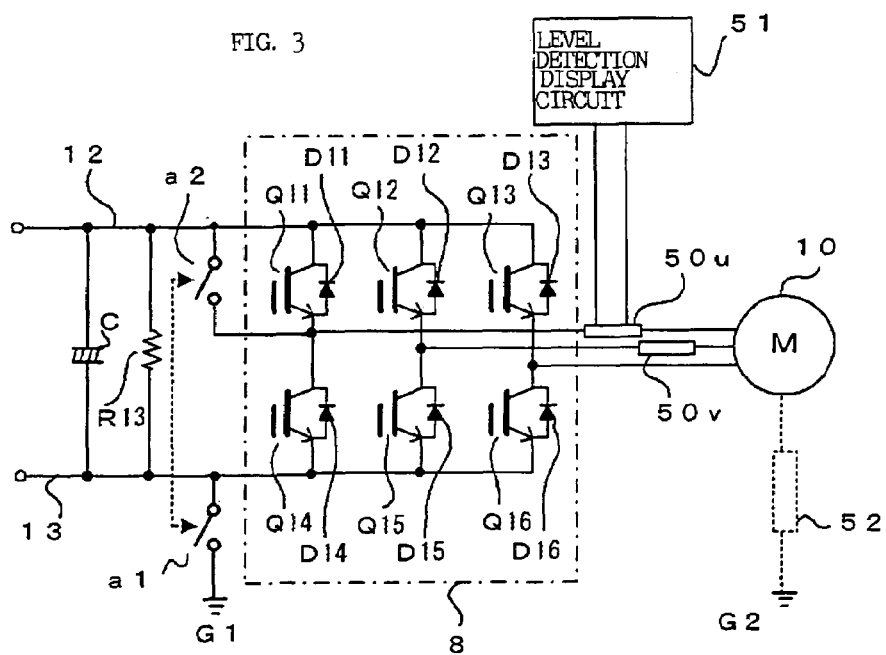
FIG. 3 is a circuit drawing of an essential part showing a third embodiment of the motor insulation resistance deterioration detection device according to the present invention.

FIG. 3 is a figure of an essential part of a third embodiment in which the insulation resistance deterioration detection method of the present invention is carried out using the current detector provided in the motor driver. In FIG. 3, only the motor drive amplifier 8 is illustrated, and the power supply section is not illustrated.

In this embodiment, the insulation resistance deterioration detection device which carries out insulation resistance deterioration detection of the motor is configured with the first contact point a1 for connecting one end of the capacitor C (specifically, the negative-side line 13 in the DC link section) to ground, the second contact point a2 for connecting the other end of the capacitor C (specifically, the positive-side line 12 in the DC link section) to one phase of the connecting wire for connecting the coil of the motor 10, and a level detection display circuit 51 connected to the outputs of current detectors 50$u$, 50$v$ and detecting and displaying the output levels thereof. The current detectors 50$u$, 50$v$ are provided in the motor driver, and detect currents flowing through a U-phase coil and a V-phase coil of the motor. It should be noted that reference numeral 52 shown with a dashed line in FIG. 3 shows a motor insulation to ground.

In order to detect insulation resistance deterioration of the motor 10, the switching elements Q11 through Q16 are switched OFF to stop the operation of the motor 10. Then, after the electromagnetic switch contacts 5 are switched OFF, the first and second contact points a1 and a2 are switched ON by means of manual operation or actuating the relay. The negative-side line 13 in the DC link section is connected to ground by switching the first contact point a1 ON. The positive-side line 12 in the DC link section is connected to a U-phase line (the phase that the current detector 50u has) of the connecting wire for connecting the coil of the motor 10, and the level detection display circuit 51 is connected to the output side of the current detector 50u (the current detector for detecting the current in the U phase), by switching the second contact point a2 ON. As a result, a closed circuit of the capacitor C, second contact point a2, current detector 50u of the U phase, U-phase coil of the motor 10, the motor insulation resistance to ground 52, grounds G2 and G1, first contact point a1, and capacitor C is formed, and the energy accumulated in the capacitor C is discharged via this closed circuit. The magnitude of the current flowing through the closed circuit is displayed by the level detection display circuit 51, whereby insulation deterioration of the motor 10 can be detected by a value displayed by the level detection display circuit 51.

Moreover, as in the embodiments described hereinafter, the comparator which compares a current detection value with a reference value, which is set in advance, may be provided in the current detector S to inform that the insulation of the motor has deteriorated by outputting an alarm signal when the current detection value exceeds the reference value, and displaying the alarm with a lamp or the like. Further, conditions of the insulation of the motor may be displayed by converting the current detection signal to a digital signal by means of an A/D converter and displaying thus obtained value to a display device.

In addition, in the above embodiment, the negative-side line 13 in the DC link section is connected to the ground G1 through the first contact point a1. However, when the relay contact point cannot be connected to ground directly, a power supply 15 may be provided to connect the negative-side line 13 of the DC link section to the ground G1 via the power supply 15, as shown with the dashed line in FIG. 1.

Figure 4:
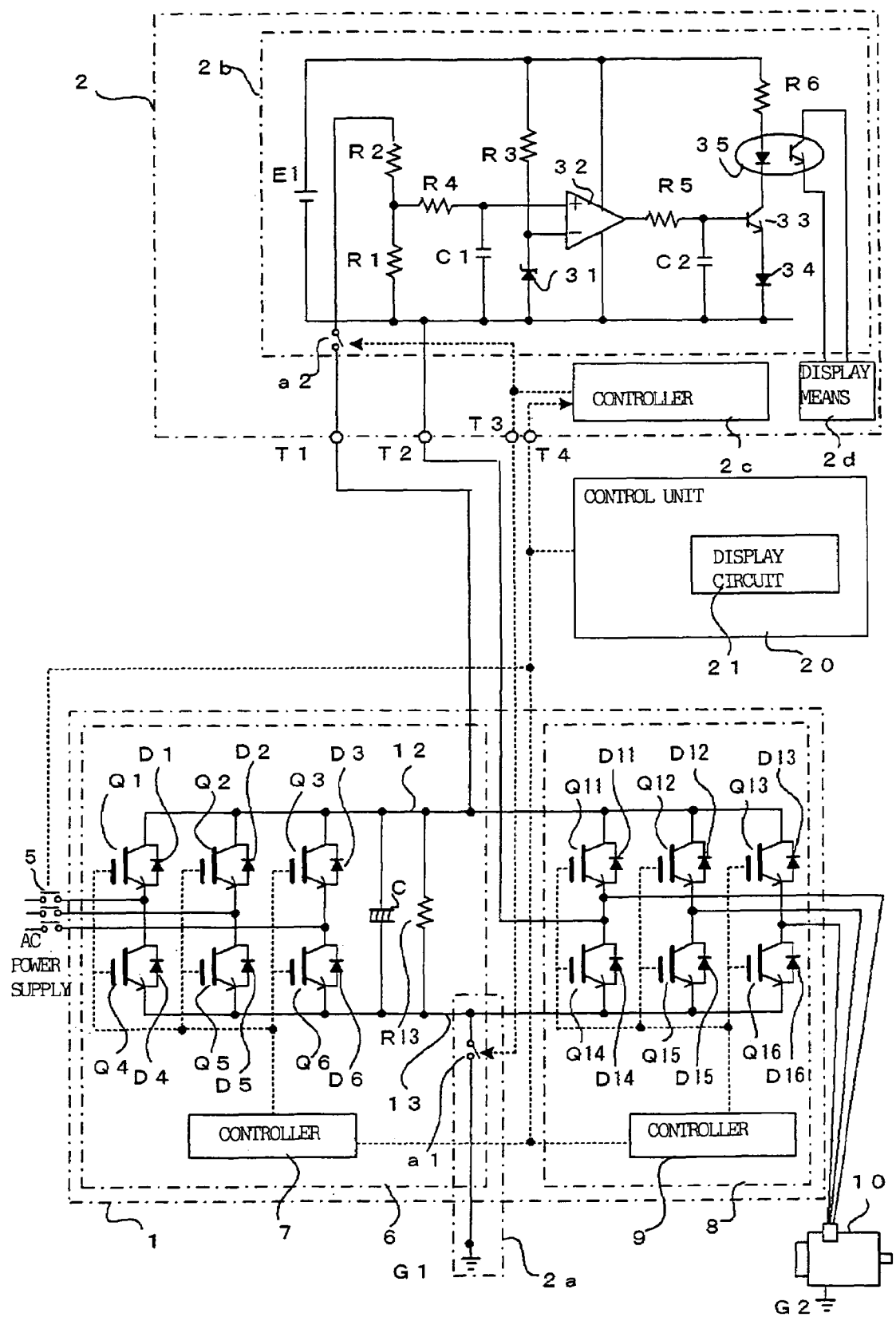
FIG. 4 is a circuit drawing showing a fourth embodiment of the motor insulation resistance deterioration detection device according to the present invention.

FIG. 4 is a block drawing of a fourth embodiment of the insulation resistance deterioration detection device of a motor described above, and a block drawing showing the relationship between the motor driver and the motor.

The motor insulation resistance deterioration detection device is configured with the insulation resistance deterioration detection device main body 2 of a motor, and a ground connection section 2a having a relay contact point a1 for connecting one of the lines in the DC link section (the negative-side line 13 in FIG. 4) to ground.

The motor insulation resistance deterioration detection device main body 2 is configured with a voltage detection circuit 2b, a controller 2c, and display means 2d. The voltage detection circuit 2b has a contact point a2 of a relay incorporated into the controller 2c, resistors R1 through R6, capacitors C1 and C2, Zener diode 31, comparator 32, transistor 33, diode 34, and photo coupler 35. The motor insulation resistance deterioration detection device main body 2 further has terminal T1, T2 for connecting the motor insulation resistance deterioration detection device main body 2 to the motor driver 1, a terminal T3 which connects a signal line controlling the relay contact point a1 in the ground connection section 2a to the controller 2c, and a terminal T4 which connects the motor insulation resistance deterioration detection device main body 2 to a control unit 20 such as a numerical control unit for controlling the motor driver 1.

In order to measure an insulation resistance of the motor, the terminal T1 in the motor insulation resistance deterioration detection device main body 2 is connected to the positive-side output line 12 of the DC link section, the terminal T2 is connected to one phase line of the connecting wire for connecting the inverter circuit of the motor drive amplifier 8 to the coil of the motor 10, the terminal T3 is connected to the signal line for controlling the relay contact point a1 of the ground connection section 2a, and the terminal T4 is connected to a signal line for controlling ON/OFF operation of the electromagnetic switch contacts 5 (this signal line is outputted from the control unit 20).

When operating the motor 10, the electromagnetic switch contacts 5 are switched ON based on the commands from the control unit 20, such as a numerical control unit, for controlling the motor driver 1, whereby three-phase AC power supply is connected to the power supply section 6 of the motor driver 1. The electric power from the three-phase power supply is rectified by the diodes D1 through D6 to charge the smoothing capacitor C. This rectified DC power supply is supplied to the motor drive amplifier 8 via the DC link section, and the controller 9 controls ON/OFF operations of the switching elements Q11 through Q16 to drive-control the motor 10.

When the operation of the motor 10 is stopped to stop supply of the electric power of the three-phase power supply, the control unit 20 switches OFF the switching elements Q11 through Q16 by means of the controller 9, and outputs a signal for switching the electromagnetic switch contacts 5 OFF to switch the electromagnetic switch contacts 5 OFF. This signal is also inputted to the controller 2c of the motor insulation resistance deterioration detection device main body 2 via the terminal T4.

Upon receiving the signal for switching the electromagnetic switch contacts 5 OFF, the controller 2c operates the relay to switch the contact points a1, a2 ON. The supply of the electric power to the power supply section 6 is stopped by switching the electromagnetic switch contacts 5 OFF, and charging voltage for the smoothing capacitor C is applied to the motor 10 via the contact points a1, a2 and the detection resistor R1. Specifically, a closed circuit is formed by the positive-side terminal of the smoothing capacitor C, the positive-side line 12 in the DC link section, relay contact point a2, protection resistor R2, detection resistor R1, one phase winding of the motor, the insulation resistance of the motor 10 (including its parasitic capacitance), grounds G2 and G1, contact point a1, and the negative-side terminal of smoothing capacitor C.

Through this formation of the closed circuit, the motor insulation resistance to ground and the detection resistor R1, having the positive-side terminal and negative-side terminal of the capacitor C between them, are connected in series, thus a current (leakage current) flows through the closed circuit. Since the potential difference between the both ends of the detection resistor R1 varies according to the magnitude of this current, the motor insulation resistance to ground can be measured by the magnitude of the potential difference. If the motor insulation resistance to ground decreases, the current (leakage current) becomes large, whereby the potential difference between the both ends of the detection resistor R1 becomes large.

If the potential difference between the both ends of the detection resistor R1 does not exceed the reference voltage determined by Zener diode 31, no signal is outputted from the comparator 32. However, if the reference voltage is exceeded (if the insulation resistance of the motor 10 is deteriorated, the insulation resistance to ground is lowered, and the flowing current is increased), an output signal is outputted from the comparator 32 to switch ON the transistor 33, as a result of which current flows into a light-emitting element in the photo coupler, the output signal from the photo coupler 35 is inputted to the display means 2d, and an indication of deterioration of insulation resistance of the motor 10 is displayed by the display means 2d. It should be noted that the signal from the photo coupler may be inputted to the control unit 20 through the controller 2c to display deteriorated insulation resistance to a display circuit 21, without providing the display mean 2d. Seeing this display, an operator can take action such as replacing the motor 10.

It should be noted that, immediately after the contact points a1 and a2 are closed, the voltage detected by the detection resistor R1 fluctuates while the parasitic capacitance between the motor and ground is being charged. However, after a lapse of a certain period of time since the contact points a1 and a2 were closed, charging of the parasitic capacitance between the motor and ground is stabilized, and, under such circumstances, the potential difference between the both ends of the detection resistor R1 (the motor insulation resistance to ground) may be measured.

It should be noted that, when driving the motor drive amplifier 8 to operate the motor 10, the relay contact points a1 and a2 are kept in the OFF state.

In the above-described fourth embodiment, the voltage detected by the detection resistor R1 is compared with the reference voltage for detecting motor insulation resistance deterioration, to detect insulation resistance deterioration when the detection voltage exceeds the reference voltage, but simply a motor insulation resistance may be detected.

Figure 5:
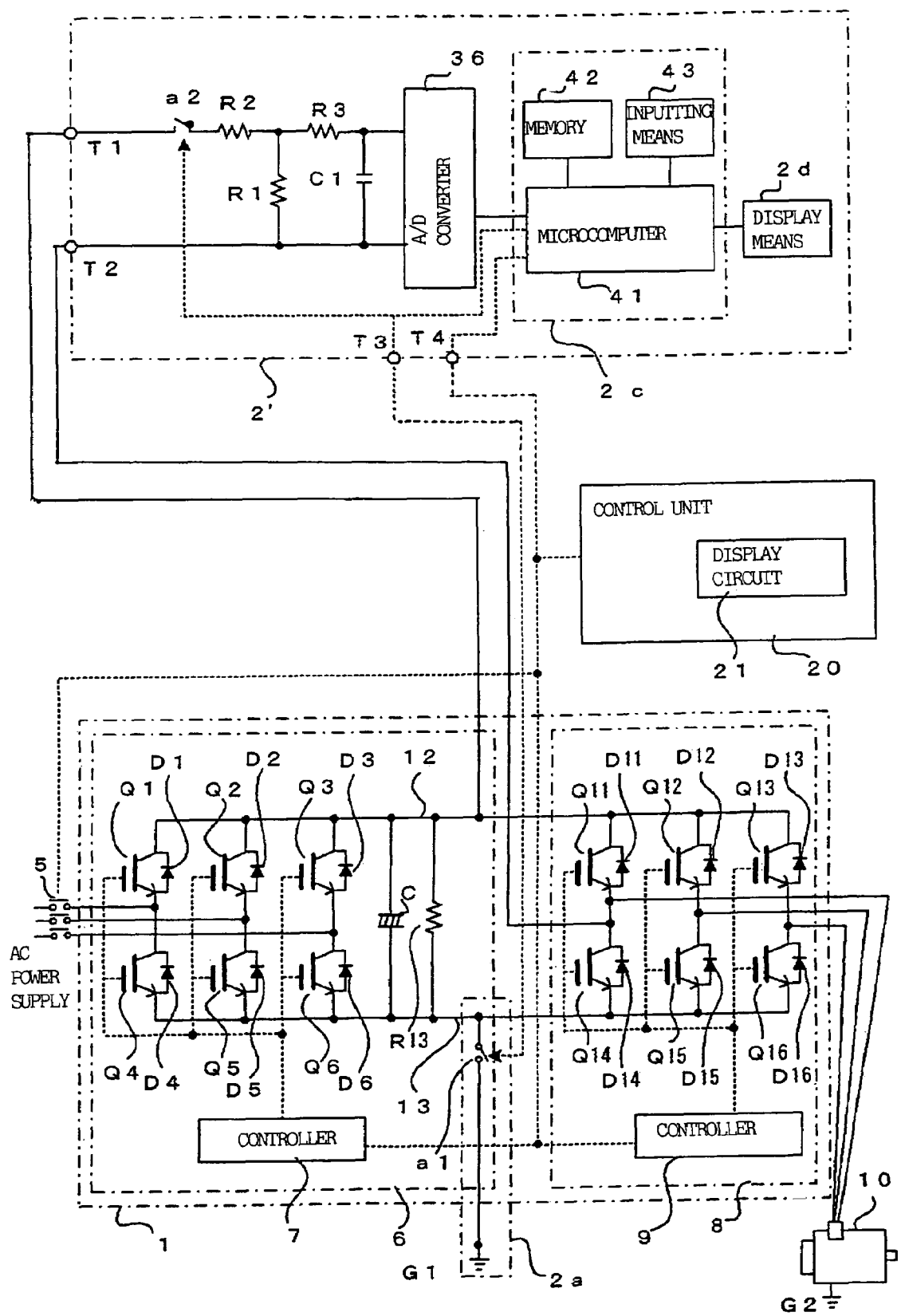
FIG. 5 is a circuit drawing showing a fifth embodiment of the motor insulation resistance deterioration detection device according to the present invention.

FIG. 5 is an explanatory drawing of a fifth embodiment of the motor insulation resistance deterioration detection method and the insulation resistance deterioration detection device of the present invention. In this embodiment, insulation resistance deterioration can also be detected on the basis of the specifications (type) of the motor drive amplifier in the motor driver, or the specifications (type) of the motor. Moreover, the detected potential difference (data indicating the leakage current and showing an insulation resistance value) is stored so that the stored and accumulated data can be displayed as the history of the insulation.

In the present embodiment, the motor insulation resistance deterioration detection device is configured with a motor insulation resistance deterioration detection device main body 2' and the ground connection section 2a (this section is same as in the fourth embodiment). This embodiment is same as the fourth embodiment (FIG. 4) in terms of that the relay contact points a1 and a2, detection resistor R1, protection resistor R2, filtering resistor R3, capacitor C1, display means 2d, and terminals T1 through T4 are provided. However, the detection circuit of the present embodiment differs from the detection circuit 2b of the fourth embodiment in terms of that the potential difference across the detection resistor R1 is inputted to an A/D converter (a converter for converting between an analog signal to a digital signal) 36. Moreover, a controller 2'c of the present embodiment differs from the controller 2c of the fourth embodiment in terms of that the controller 2'c has a microcomputer 41, memory 42, and data inputting means 43, while the controller 2c of the fourth embodiment does not have such components.

In addition, in the present embodiment, the memory 42 of the controller 2'c has stored therein, in advance, a reference value for displaying motor insulation resistance deterioration on the basis of the specifications (type) of various motor drive amplifiers 8 used in the motor driver 1 or the specifications (type) of the motor.

Therefore, when detecting an insulation resistance, the specifications (type) of the motor drive amplifier is set by the data inputting means 43 to determine a reference value. Then, as in the fourth embodiment, the terminal T1 of the insulation resistance deterioration detection device main body 2' is connected to the positive-side output line 12 of the DC link section, the terminal T2 is connected to one phase line of the connecting wire for connecting the inverter circuit of the motor drive amplifier 8 to coil of the motor 10, the terminal T3 is connected to the signal line controlling the relay contact point a1 in the ground connection section 2a, and the terminal T4 is connected to the signal line controlling ON/OFF operations of the electromagnetic switch contacts 5 (this signal line is connected to the control unit 20).

An off command is outputted from the control unit 20, and the electromagnetic switch contacts 5 are turned OFF. The microcomputer 41 receives the off signal of the electromagnetic switch contacts 5 via the terminal T4 to operate the relay and switch the contact points a1 and a2 ON. As a result, the charging voltage for the smoothing capacitor C is applied to the protection resistor R2, detection resistor R1, the coil of the motor 10, and ground, whereby leakage current flows. The potential difference across the detection resistor R1, which is generated by the leakage current, is converted to a digital signal by the A/D converter 36.

The microcomputer 41 then reads the detected potential difference, and stores it in the memory 42. The microcomputer 41 further compares the detected potential difference with the reference value corresponding to the set motor type, and, if the detected potential difference exceeds the reference value, sends a signal to the display means 2d to display insulation resistance deterioration. Data of the detected potential difference at this time is also displayed. The signal indicating the insulation resistance deterioration and the data of the detected potential difference are transmitted to the control unit 20. Upon receiving this signal, the control unit 20 may cause the display circuit 21 to display deterioration of the insulation resistance to ground or to display the data of the detected potential difference.

Further, by inputting a command for displaying the history of the detected insulation resistance from the data inputting means 43, the microcomputer 41 causes the display means 2d to display the data of the detected potential difference accumulated in the memory, in the form of a list. Further, the microcomputer 41 causes the display means 2d to display the data of the accumulated detected potential difference, in the form of a graph.

By performing the measurement of the insulation resistance regularly to store the measured data in the memory 42, the insulation resistance values (data of the detected potential difference) can be obtained in chronological order, and are displayed as a history. Moreover, a clock may be provided in the microcomputer 41 to store the measured insulation resistance values (data of the detected potential difference) in the memory 42 in association with the date and time when the measurement is performed, and when displaying the history, the time data and the insulation resistance values (data of the detected potential difference) may be displayed in the form of a list or a graph in chronological order.

When a clock or the like is not provided in the microcomputer 41, the measured insulation resistance values (data of the detected potential difference) are transmitted to the control unit 20. The control unit 20 stores the received insulation resistance values (data of the detected potential difference) and the date and time when the insulation resistance values are measured, in the memory provided in the control unit 20. The command for displaying the motor insulation resistance history is inputted by the inputting means provided in the control unit 20, whereby the motor insulation resistance values (data of the detected potential difference) stored and accumulated in the memory are displayed in chronological order in the form of a list, or displayed visually in the form of a graph by using the display circuit 21.

In the fourth and fifth embodiments described above, the leakage current is detected on the basis of the potential difference between the both ends of the detection resistor R1, but the current flowing through the closed circuit may be detected using Hall elements.

Figure 6:
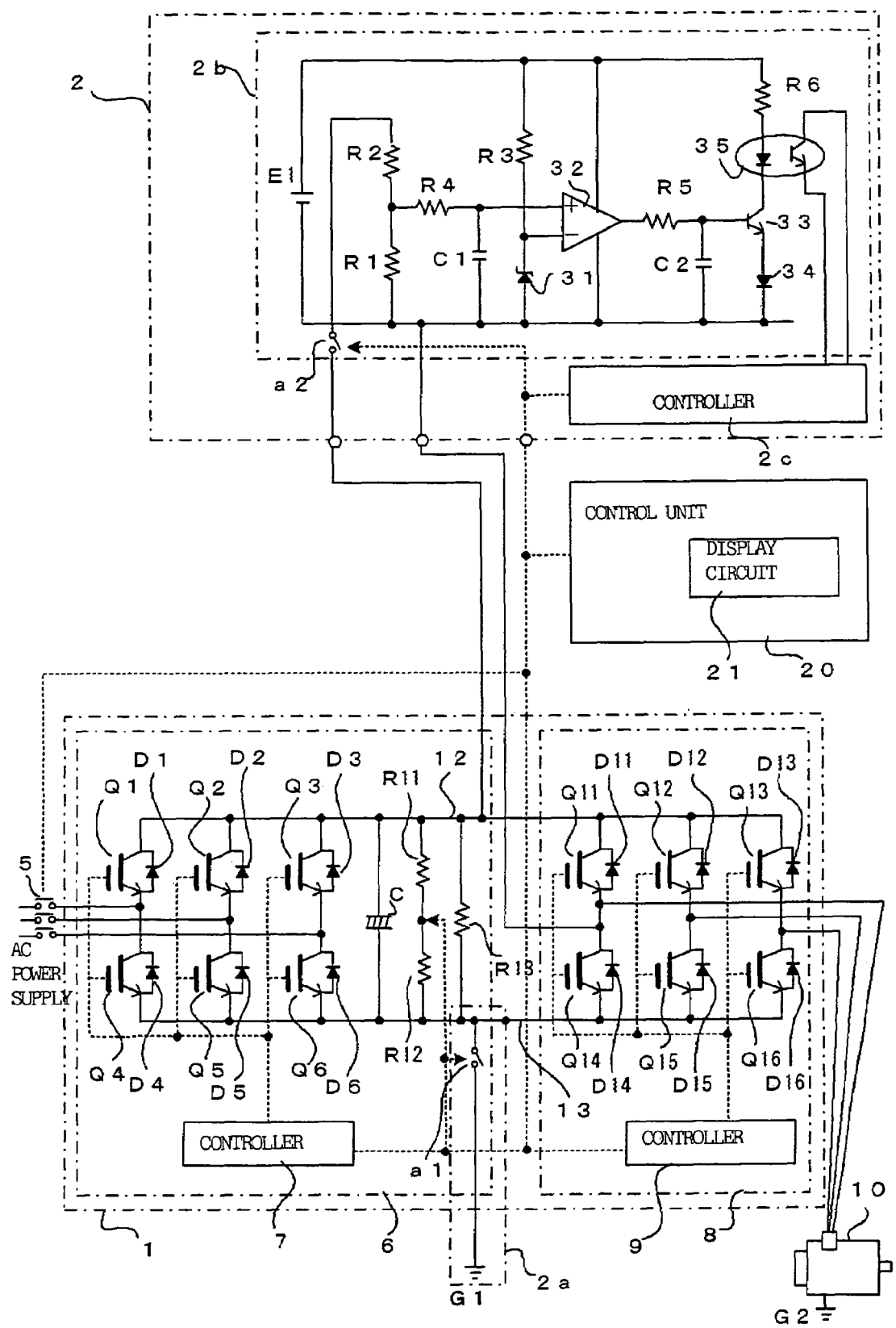
FIG. 6 is a circuit drawing showing a sixth embodiment of the motor insulation resistance deterioration detection device according to the present invention.

FIG. 6 is a block drawing of a sixth embodiment of the motor insulation resistance deterioration detection device according to the present invention. This embodiment is the one in which the motor insulation resistance deterioration detection device shown in FIG. 4 (fourth embodiment) is additionally provided with voltage detection means for detecting charging voltage for the smoothing capacitor C.

The connection between the motor driver 1 and the motor insulation resistance deterioration detection device (the motor insulation resistance deterioration detection device 2 and the ground connection section 2a) is same as the connection between the motor driver 1 and the motor insulation resistance deterioration detection device (the motor insulation resistance deterioration detection device 2 and the ground connection section 2a) that are shown in FIG. 4. In FIG. 6, the connections between the motor insulation resistance deterioration detection device, the control unit 20, a controller 2c of the motor insulation resistance deterioration detection device, and controllers 7, 9 in the motor driver 1 are illustrated with a single dashed line.

Furthermore, in this embodiment, the display circuit 21 provided in the control unit 20 for controlling the motor is allowed to have a function that the display means 2d in the motor insulation resistance deterioration detection device main body 2 in FIG. 4 has, thus the display means is eliminated from the insulation resistance deterioration detection device main body 2 of FIG. 6.

In order to detect the voltages at both ends of the smoothing capacitor C of the motor driver 1, the voltage at the each end of the smoothing capacitor C is divided by the resistors R11 and R12 and used by the controller 2c to start the operation of detecting motor insulation resistance.

According to the sixth embodiment, after the electromagnetic switch contacts 5 are switched OFF, the energy of the smoothing capacitor C is discharged via the resistor R13, and the charging voltage of the smoothing capacitor C decreases. The charging voltage of the smoothing capacitor C is divided by the resistors R11 and R12 to detect the charging voltage. At a point of time when this detected voltage reaches a previously set voltage, a command signal for starting measurement of insulation resistance is outputted. According to this method, there is an advantage that the measurement of insulation resistance is performed at the same voltage on a device such that input power supply voltage of the motor driver main body 1 is 200V/400V, thus the measurement can be performed accurately without having a measurement result affected by the input power supply voltage for the motor driver main body 1.

The control unit 20 switches OFF the switching elements Q11 through Q16 by means of the controller 9 to stop the operation of the motor, and outputs a signal for switching the electromagnetic switch contacts 5 OFF to switch OFF the electromagnetic switch contacts 5. Consequently, the charge accumulated in the smoothing capacitor C is gradually discharged through the discharging resistor R13. The voltage at this time is divided by the resistors R11 and R12, and this divided voltage is detected by the controller 2c of the motor insulation resistance deterioration detection device main body 2. At a point of time when this detected voltage reaches a previously set voltage, the controller 2c of the motor insulation resistance deterioration detection device main body 2 actuates the relay to close the contact points a1 and a2. Thereafter, the charging voltage of the smoothing capacitor C is applied to the motor 10 via the detection resistor R1. Specifically, a closed circuit is formed by the positive-side terminal of the smoothing capacitor C, the positive-side line 12 in the DC link section, relay contact point a2, protection resistor R2, detection resistor R1, one phase winding of the motor, insulation resistance of the motor 10, grounds G2 and G1, contact point a1, and the negative-side terminal of smoothing capacitor C.

Accordingly, the motor insulation resistance to ground and the detection resistor R1, having the positive-side terminal and negative-side terminal of the capacitor C between then, are connected in series. Thus, if the potential difference between the both ends of the detection resistor R1, generated by a current (leakage current) flowing through the closed circuit, exceeds the reference voltage determined by Zener diode 31, a signal is outputted from the comparator 32. As a result, the transistor 33 is turned ON, current flows into a light-emitting element in the photo coupler, the output signal from the photo coupler 35 is inputted to the control unit 20 via the controller 2c, and an indication of deteriorated insulation resistance to ground is displayed by the display circuit 21.

In the sixth embodiment, the voltage of the smoothing capacitor C, which is divided by the resistors R11 and R12, id detected by the controller 7 in the power supply section 6, and at a point of time when the detected voltage has reached set voltage, the contact points a1 and a2 are closed. However, as in the fourth embodiment, the contact points a1 and a2 may be switched ON at the same time as the electromagnetic switch contacts 5 are switched OFF, and when the voltage of the smoothing capacitor C, which is divided by the resistors R11 and R12, has reached a set value, the detected value of the current (leakage current) flowing through the closed circuit may be latched so that insulation resistance deterioration can be detected more accurately.

Figure 7:
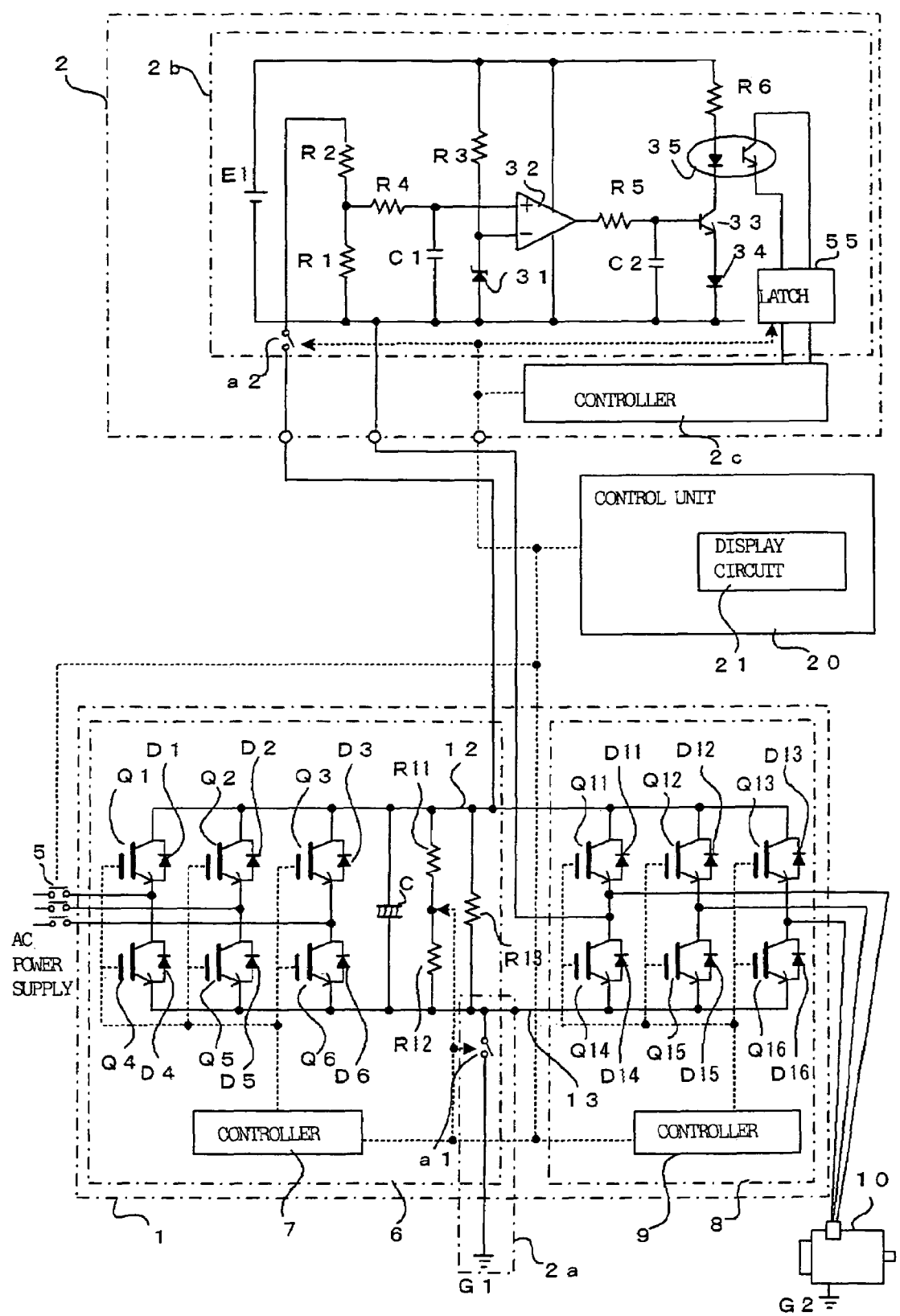
FIG. 7 is a circuit drawing showing a seventh embodiment of the motor insulation resistance deterioration detection device according to the present invention.

FIG. 7 is a circuit drawing of a seventh embodiment in which the detected value of the flowing leakage current is latched when the voltage of the smoothing capacitor-C reaches predetermined voltage. The seventh embodiment shown in FIG. 7 differs from the sixth embodiment (FIG. 6) in that the motor insulation resistance deterioration detection device main body 2 of the seventh embodiment is provided with a latch circuit 55.

The control unit 20 switches OFF the switching elements Q11 through Q16 by means of the controller 9 to output a signal for switching the electromagnetic switch contacts 5 OFF to switch OFF the electromagnetic switch contacts 5. Further, this signal is also inputted to the controller 2c of the motor insulation resistance deterioration detection device main body 2 via the terminal T4. Upon receiving the signal for switching OFF the electromagnetic switch contacts 5, the controller 2c operates the relay to switch the contact points a1 and a2 ON. Accordingly, the charging voltage of the smoothing capacitor C is applied to the motor 10 via the contact points a1, a2, detection resistor R1, and the like.

At a point of time when the charging voltage of the smoothing capacitor C, which is divided by the resistors R11 and R12, reaches previously set voltage, the controller 2c of the motor insulation resistance deterioration detection device main body 2 sends a command to the latch circuit 55 to operate the latch circuit, and latches the output from the photo coupler 35. Alternatively, with such a photo coupler 35 omitted, the controller 2c may latch the output from the comparator 32 in the latch circuit 55, instead of the output of the photo coupler 35.

As described above, if the potential difference between the both ends of the detection resistor R1, generated by the leakage current, exceeds the reference voltage, an output signal is outputted from the comparator 32, and a signal is outputted from the photo coupler 35. Consequently, a result of a determination of the magnitude of the leakage current when the charging voltage of the smoothing capacitor C becomes a predetermined value (result of determination obtained from the comparator 32) is latched, and the output of the latch circuit 55 may be read by the controller 2c and displayed.

Figure 8:
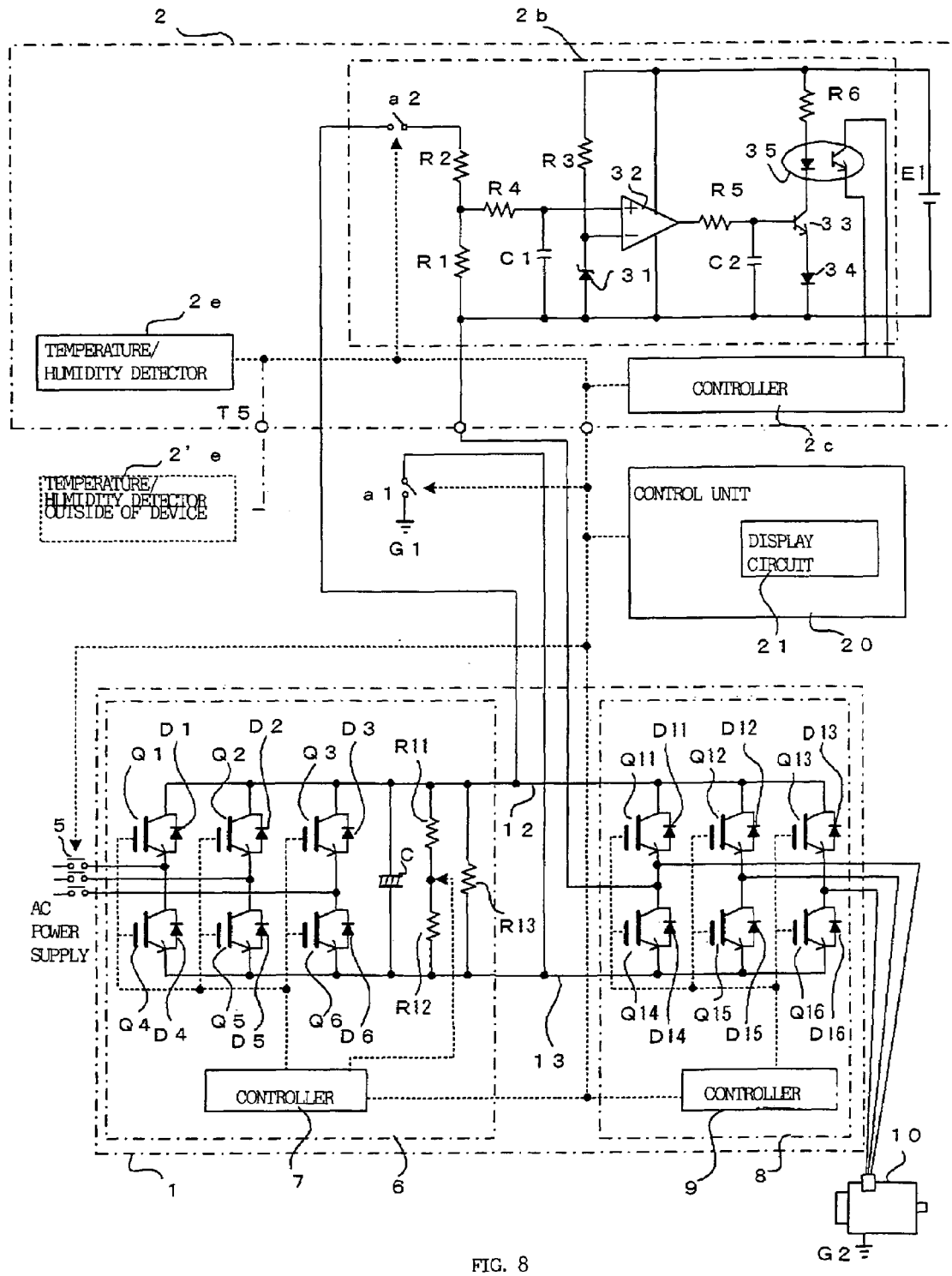
FIG. 8 is a circuit drawing showing an eighth embodiment of the motor insulation resistance deterioration detection device according to the present invention.

FIG. 8 is a circuit drawing of an eighth embodiment of the motor insulation resistance deterioration detection device according to the present invention.

The insulation resistance of the motor is affected by the ambient temperature, humidity and the like where the motor is placed. The insulation resistance decreases, especially in high humidity. For this reason, a measured value fluctuates according to the temperature and humidity in which insulation resistance is measured. In consideration of the impact of the temperature and humidity on a value of measured insulation resistance, in the eighth embodiment, therefore, a temperature/humidity detector is provided so that temperature/humidity in which insulation resistance is measured can be displayed.

The eighth embodiment is the one in which the motor insulation resistance deterioration detection device shown of the sixth embodiment (FIG. 6) is additionally provided with a temperature/humidity detector 2e. The temperature/humidity detector 2e is connected to the controller 2c of the insulation resistance deterioration detection device main body 2. Furthermore, an interface (terminal T5) for connecting the temperature/humidity detector may be provided without providing the temperature/humidity detector 2e in the motor insulation resistance deterioration detection device main body 2, to connect an external temperature/humidity detector 2'e to the motor insulation resistance deterioration detection device so that the external temperature/humidity detector 2'e is connected to the controller 2c, as shown with chain lines in FIG. 8.

Measurement of motor insulation resistance is carried out in the same manner as in the measurement in the sixth embodiment.

When a signal indicating insulation resistance deterioration is outputted from the photo coupler 35, the controller 2c reads out data of temperature/humidity detected in the temperature/humidity detector 2e, and outputs the temperature/humidity data to the control unit 20, along with the signal indicating insulation resistance deterioration. As a result, deterioration of insulation resistance to ground is displayed by the display circuit 21, and the temperature and humidity are also displayed by the display circuit 21.

Other configurations and operations are same as those of the sixth embodiment shown in FIG. 6, thus the explanations are omitted accordingly.

Figure 9:
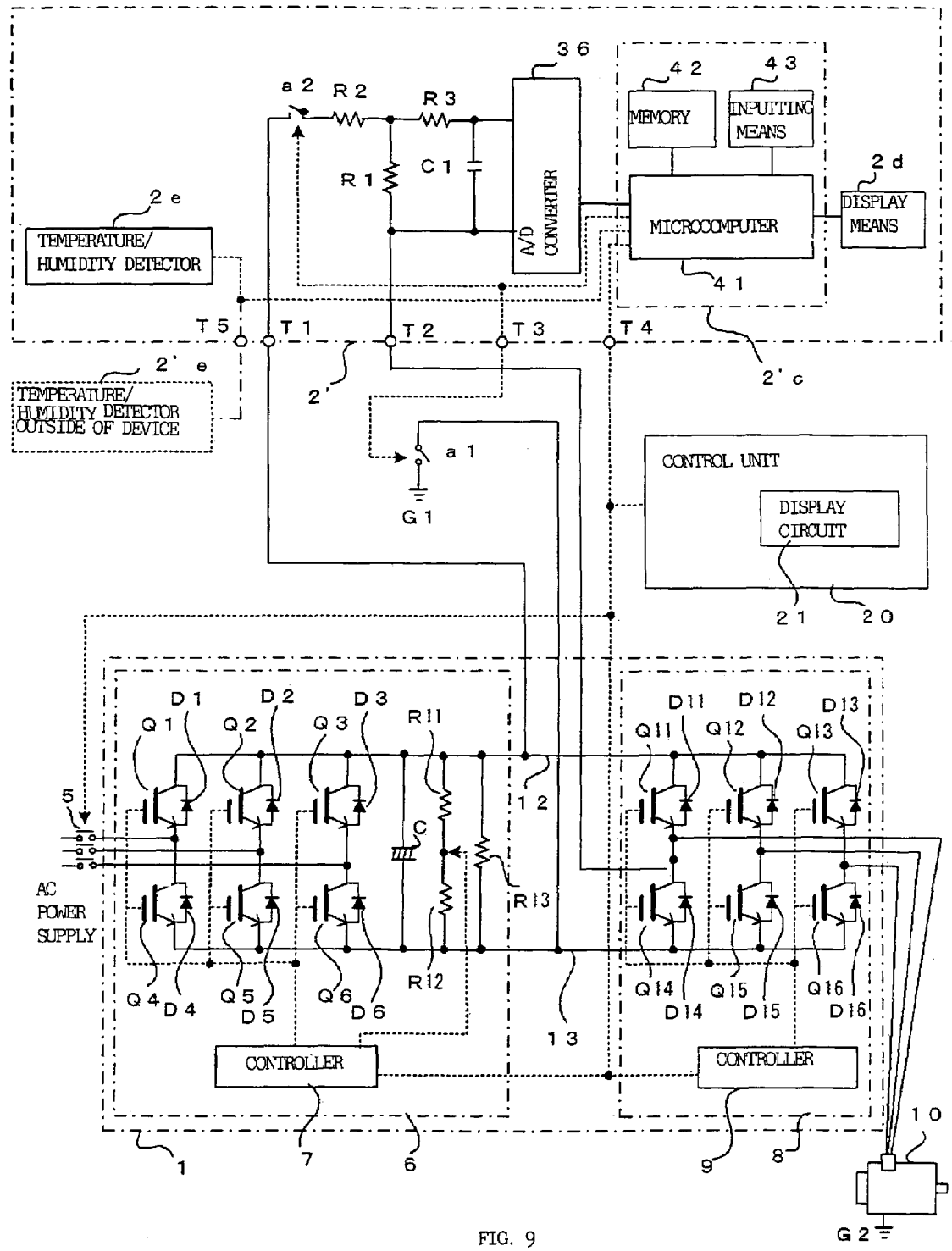
FIG. 9 is a circuit drawing showing a ninth embodiment of the motor insulation resistance deterioration detection device according to the present invention.

It should be noted that, instead of providing the temperature/humidity detector 2e in the motor insulation resistance deterioration detection device main body 2', an interface (terminal T5) for connecting the temperature/humidity detector may be provided to connect an external temperature/humidity detector 2'e to the motor insulation resistance deterioration detection device so that the external temperature/humidity detector 2'e is connected to the microcomputer 41 of the controller 2'c, as shown with chain lines in FIG. 9.

In the fourth embodiment (FIG. 4) and the seventh embodiment (FIG. 7) of the present invention as well, the temperature/humidity detector 2e may be provided to display deterioration of insulation resistance along with the temperature and/or humidity when measuring the insulation resistance. Further, the temperature/humidity detector 2e may be provided in the fifth embodiment (FIG. 5) as well. A ninth embodiment of the present invention which is obtained by providing the temperature/humidity detector 2e in the fifth embodiment is shown in FIG. 9.

The combination of the motor insulation resistance deterioration detection device main body 2' and the motor driver 1 in the ninth embodiment is same as the combination of those in the fifth embodiment. The difference with the fifth embodiment is that, in the present embodiment, the temperature/humidity detector 2e for measuring temperature and humidity is provided in the motor insulation resistance deterioration detection device main body 2', and the temperature/humidity detector 2e is connected to the microcomputer 41 of the controller 2c' in the motor insulation resistance deterioration detection device.

In this embodiment, as in the case of the eighth embodiment, instead of providing the temperature/humidity detector 2e in the motor insulation resistance deterioration detection device main body 2, an interface (terminal T5) for connecting the temperature/humidity detector may be provided to connect the external temperature/humidity detector 2'e to the motor insulation resistance deterioration detection device so that the external temperature/humidity detector 2'e is connected to the microcomputer 41 of the controller 2'c, as shown with chain lines in FIG. 9.

When reading a detected potential difference from the A/D converter 36 when measuring insulation resistance, and storing the potential difference in the memory 42, the microcomputer 41 also stores data of the temperature and humidity detected by the temperature/humidity detector 2e. The microcomputer 41 further compares the detected potential difference with the reference value corresponding to the set motor type, and, if the detected potential difference exceeds the reference value, sends a signal to the display means 2d to display insulation resistance deterioration and data of the detected potential difference along with the temperature/humidity. Further, the microcomputer 41 sends the signal indicating insulation resistance deterioration, the detected potential difference data, and the temperature/humidity data to the control unit 20. Upon receiving this signal, the control unit 20 may cause the display circuit 21 to display deterioration of the insulation resistance to ground or to display the detected potential difference data and the temperature/humidity data.

Further, upon receiving a command for displaying the history of the detected insulation resistance from the data inputting means 43, the microcomputer 41 causes the display means 2*d* to display the detected potential difference data and temperature/humidity data accumulated in the memory, in the form of a list. Further, the microcomputer 41 causes the display means 2*d* to display the data of the accumulated detected potential difference and of the temperature/humidity, in the form of a graph. By performing the measurement of the insulation resistance regularly to store the measured data in the memory 42, the insulation resistance values (data of the detected potential difference) and the temperature/humidity data can be obtained in chronological order, and are displayed as a history. Moreover, a clock may be provided in the microcomputer 41 to store the measured insulation resistance values (data of the detected potential difference) and the temperature/humidity data in the memory 42 in association with the date and time when the measurement is performed, and, when displaying the history, the time data, the insulation resistance values (data of the detected potential difference), and the temperature/humidity data may be displayed in the form of a list or a graph in chronological order.

When a clock or the like is not provided in the microcomputer 41, the measured insulation resistance values (data of the detected potential difference) and the temperature/humidity data are transmitted to the control unit 20. The control unit 20 stores the received insulation resistance values (data of the detected potential difference) along with the date and time when the insulation resistance values are measured, in the memory provided in the control unit 20. The command for displaying the motor insulation resistance history is inputted by the inputting means provided in the control unit 20, whereby the motor insulation resistance values (data of the detected potential difference) stored and accumulated in the memory, and the temperature/humidity data are displayed in chronological order in the form of a list, or displayed visually in the form of a graph by using the display circuit 21.

In the eighth embodiment and the ninth embodiment of the present invention, the temperature/humidity detector is provided to detect temperature and humidity, as described above, but either temperature or humidity may be detected. Particularly, humidity has a great impact on motor insulation resistance, thus only humidity may be detected by providing a humidity detector.

It should be noted that the motor insulation resistance deterioration detection devices shown in the first through seventh embodiments can be incorporated into the motor driver. Particularly, when incorporating the insulation resistance deterioration detection device of the third embodiment (FIG. 3) into the motor driver, the display device which is provided in the motor driver or a host control unit of a numerical control unit or the like connected to the motor driver (simply by providing the contact points a1 and a2 in the display device) can be used instead of the level detection display circuit 51. When detecting insulation resistance deterioration, a detected current value, which is fed back from the current detector 50*u* or 50*v*, may be displayed by the display device, or the control unit may be caused to carry out the processing of obtaining and displaying a peak value of the detected current value.

Furthermore, when incorporating the motor insulation resistance deterioration detection devices of the fifth and ninth embodiments (FIG. 5, FIG. 9) into the motor driver 1, the data inputting means 43 is provided in the motor insulation resistance deterioration detection devices to select a reference value for setting the motor type and judging deterioration of insulation resistance, but this process may be performed automatically.

The controller 9 of the motor drive amplifier 8 may be provided with a memory in which are stored the specifications (type) of the motor drive amplifier 8 or the specifications (type) of the motor. In this manner, when a command for detecting insulation resistance is inputted to the control unit 20, the control unit 20 reads the specifications (type) of the motor drive amplifier from the controller 9 of the motor drive amplifier 8, transmits the read information to the controller 2'*c* of the motor insulation resistance deterioration detection device main body 2', and at the same time transmits an insulation resistance deterioration detection command to same. The controller 2'*c* then actuates the relay in response to the insulation resistance deterioration detection command to close the relay contact points a1 and a2, and, as described above, converts the potential difference across the detection resistor R1 into a digital signal by means of the A/D converter 36. The microcomputer 41 reads the detected potential difference and writes it into the memory 42. The microcomputer 41 further reads from the memory 42 a reference value corresponding to the received specifications (type) of the motor drive amplifier or the specifications (type) of the motor, and compares the detected potential difference with the reference value. If the detected potential difference exceeds the reference value, a signal indicating deterioration of the insulation resistance is transmitted to the control unit 20. Upon receiving this signal, the control unit 20 causes the display circuit 21 to display an indication of deterioration of the insulation resistance.

What is claimed is:

1. A method of detecting insulation resistance deterioration for a motor driven by a motor driver which comprises a power supply section in which electric power supplied from an AC power supply through a switch is rectified by a rectifier circuit and smoothed by a capacitor, and a motor driving amplifier in which a DC voltage from the power supply section is converted to an AC voltage to drive the motor, the method comprises:

stopping the operation of the motor by turning the switch OFF, and then connecting one end of the capacitor to ground in conjunction with connecting the other end of the capacitor to a motor coil, after turning the switch OFF;

detecting a current that flows through a closed circuit formed with the capacitor, motor coil, and ground, to detect insulation resistance deterioration of the motor; and carrying out said insulation resistance deterioration detection by latching a signal for detecting insulation resistance deterioration by means of a latch circuit when a voltage of a predetermined value is detected by voltage detection means for detecting the potential difference between both ends of said capacitor, after the output of the signal to turn OFF the switch connected to the motor driver.

2. An insulation resistance deterioration detection device for a motor driven by a motor driver which comprises a power supply section in which electric power supplied from an AC power supply through a switch is rectified by a rectifier circuit and smoothed by a capacitor, and a motor driving amplifier in which a DC voltage from the power supply section is converted to an AC voltage to drive the motor, comprising:

a contact point for connecting one end of the capacitor to ground;

means for switching the contact point ON based on a signal sent from the motor driver to turn the switch OFF;

insulation resistance deterioration detection means, connected between the other end of the capacitor and a motor coil, for detecting a current that flows through a closed circuit which is formed with the contact point, capacitor, motor coil, and ground, to detect insulation resistance; and voltage detection means for detecting the potential difference between both ends of the capacitor, wherein said insulation resistance deterioration detection means comprises a latch circuit; and the insulation resistance deterioration detection is carried out by latching a signal for detecting insulation resistance deterioration by means of said latch circuit when the voltage detection means detects a voltage of a predetermined value after the output of the signal to turn OFF the switch connected to the motor driver.

3. The insulation resistance deterioration detection device for a motor according to claim 2, wherein a resistor or a current sensor is provided in the closed circuit, and the insulation resistance deterioration detection means detects the potential difference generated between both ends of the resistor to detect the magnitude of a flowing current or to detect the magnitude of a current flowing through the current sensor, for detecting insulation resistance deterioration of the motor.

4. The insulation resistance deterioration detection device for a motor according to claim 2, wherein the insulation resistance deterioration detection means detects insulation resistance deterioration of the motor according to the magnitude of an output from a current detector the motor driver provides for control of the motor.

5. The insulation resistance deterioration detection device for a motor according to claim 2, wherein the insulation resistance deterioration detection means comprises a comparator which compares a current detection value with a reference value, and display means for displaying a comparison result of the comparator.

6. The insulation resistance deterioration detection device for a motor according to claim 2, wherein the insulation resistance deterioration detection means comprises an A/D converter which converts the current detection value into a digital signal, a memory which stores the current detection value converted into the digital signal, and display means for displaying the current detection value converted into the digital signal, and wherein data accumulated in the memory is displayed in the form of a list or a graph, on the display means.

7. The insulation resistance deterioration detection device for a motor according to claim 6, wherein a detector which detects at least either ambient temperature or humidity is provided, or an interface for connecting the detector which detects at least either ambient temperature or humidity is provided, and temperature/humidity data detected by the detector, when detecting the current detection value, as well as data of the current detection value are stored in the memory, and the current detection value data and the temperature/humidity data are displayed on the display means in the form of a list or a graph.

8. The insulation resistance deterioration detection device for a motor according to claim 2, wherein a detector which detects at least either ambient temperature or humidity is provided, or an interface for connecting the detector which detects at least either ambient temperature or humidity is provided, to display temperature or humidity which is detected by the detector.

9. The insulation resistance deterioration detection device according to claim 2, wherein, as the power supply for flowing the current through the closed circuit in order to detect the insulation resistance deterioration, charge accumulated in the capacitor is used.

10. The insulation resistance deterioration detection device for a motor according to claim 2, wherein the contact point connects one end of the capacitor to ground via a DC power supply, instead of connecting the end of the capacitor to ground directly.

11. A motor driver, comprising the insulation resistance deterioration detection device for a motor described in any of claims 2 through 9 or 10.

* * * * *

UNITED STATES PATENT AND TRADEMARK OFFICE
CERTIFICATE OF CORRECTION

PATENT NO. : 7,253,639 B2  Page 1 of 1
APPLICATION NO. : 11/332284
DATED : August 7, 2007
INVENTOR(S) : Shinichi Horikoshi et al.

It is certified that error appears in the above-identified patent and that said Letters Patent is hereby corrected as shown below:

Column 17, Line 9, change "resistance;" to --resistance deterioration;--.

Signed and Sealed this

Twenty-fifth Day of December, 2007

JON W. DUDAS
*Director of the United States Patent and Trademark Office*